July 24, 1962 C. E. HORNER ET AL 3,046,202

METHOD OF MAKING AN APERTURED MEMBER

Filed June 24, 1957

United States Patent Office 3,046,202
Patented July 24, 1962

3,046,202

METHOD OF MAKING AN APERTURED MEMBER

Clifford E. Horner, Schuyler, and Donald R. Quinn and Charles E. Thayer, Horseheads, N.Y., assignors to Westinghouse Electric Corporation, East Pittsburgh, Pa., a corporation of Pennsylvania Filed June 24, 1957, Ser. No. 667,652
3 Claims. (Cl. 204—11)

This invention relates to a method of making an apertured member, and, more particularly, to a method for making a shadow mask electrode suitable for use in a color television cathode ray tube.

In many applications, such as shadow mask color television kinescopes, there is need for a metallic screen member with a plurality of apertures therein. The apertures of screens of this type must be identical in size and position from screen to screen if the cathode ray tubes are to be made on a mass production basis. Prior art screens of this type have been formed by a photoresist etching process that is costly and complicated. For example, a photographic negative must be obtained which is, in effect, a large number of black dots on a transparent film. A number of printing steps, shaped light sources, spacers, etc. are required to make the negative. Next a thin sheet of an appropriate metal, such as copper, is coated with a photoresist material and is exposed through the negative to light of a suitable wavelength. The exposed photoresist material is insoluble, although it may need additional hardening by a heating process, and the unexposed photoresist material may be washed away. Next an etching solution, such as a ferric chloride etching, is applied to the exposed metal and holes are etched. Finally the exposed photoresist material is removed. This method, while operable in many instances, is costly, complex and not suitable for comparatively thick screens, because the metal will be etched sideways as well as from the front, thereby enlarging the apertures.

In general, our invention concerns a method of making an apertured screen member by extruding an insulative plastic material through the apertures of a master die so that plastic columns are formed having a certain height above the conductive surface of the die. A layer of conductive material is electroplated on the conductive surface of the die to a thickness somewhat less than the height of the plastic columns. The plastic material is then removed and the electroplated layer is peeled from the die, thereby forming an apertured screen of desired dimensions and configurations.

It is an object of this invention to provide an improved method of making an aperture member.

It is another object of this invention to provide an improved method of making an apertured screen member.

It is a further object to provide an improved method of making an apertured screen member suitable for use as a shadow mask electrode in a color television cathode ray tube.

It is an additional object to provide an improved method of making an apertured screen member by an electrodeposition process.

These and other objects of our invention will be apparent from the following description taken in accordance with the accompanying drawing, throughout which like reference characters indicate like parts, which drawing forms a part of this application and in which.

Figures 1, 2, 3, 4, 5, 6:
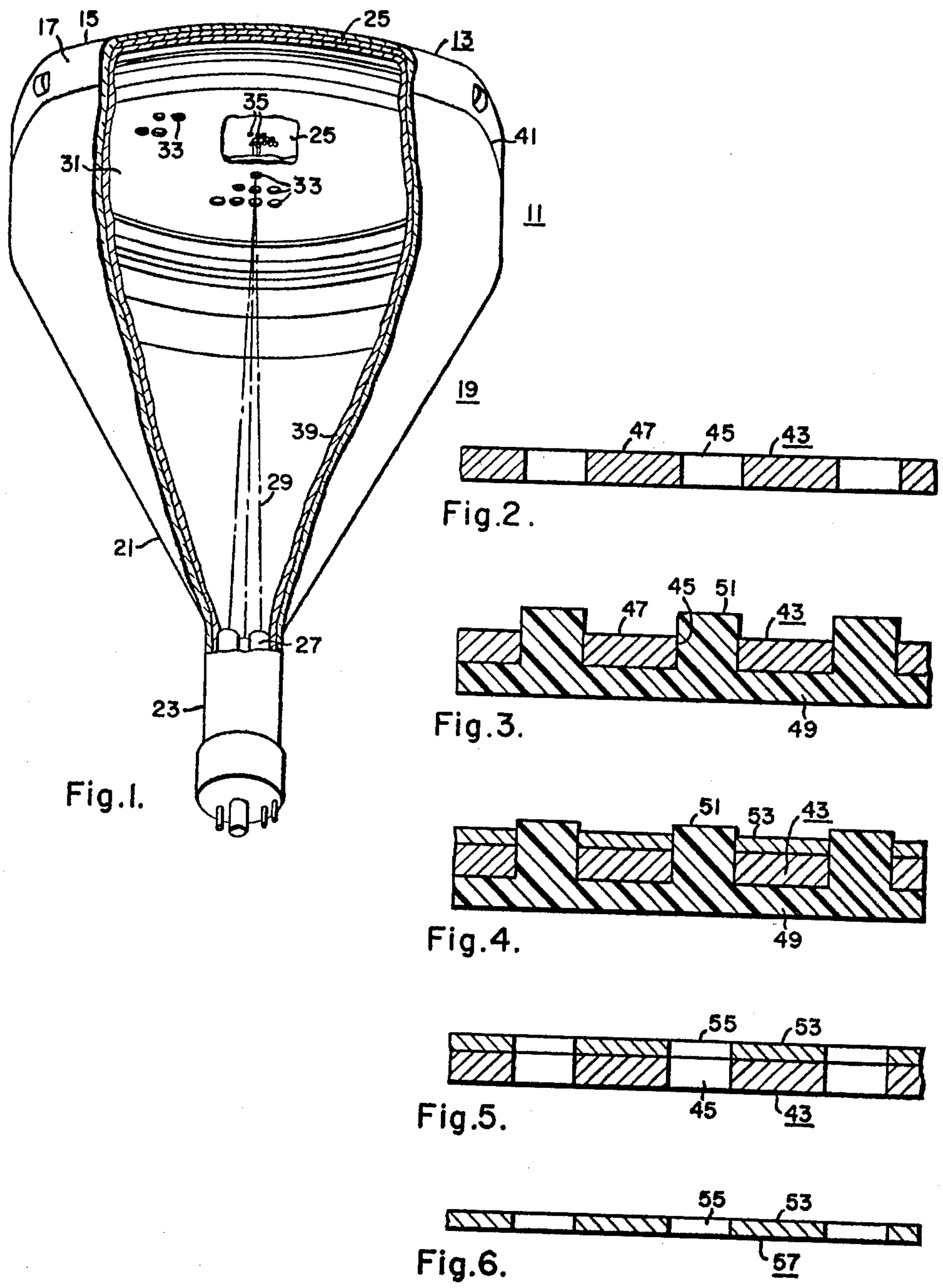
FIG. 1 is a perspective view, partly in section, of a cathode ray tube embodying this invention.
FIG. 2 is a sectional view of a portion of an apertured master die member as used in one embodiment of our invention.
FIG. 3 is a sectional view of a portion of an apertured master die member having a plastic insulative material extruded through the apertures according to one embodiment of our invention.
FIG. 4 is a sectional view similar to that shown in FIG. 3 in which a layer of conductive material has been electrodeposited upon said master die member.
FIG. 5 is a sectional view of a portion of an apertured master die member upon which a layer of conductive material has been electrodeposited after the plastic material has been removed.
FIG. 6 is a sectional view of a portion of the apertured screen member made in accordance with one embodiment of our invention.

Referring in detail to FIG. 1, there is shown a cathode ray tube utilizing a shadow mask electrode in accordance with one embodiment of our invention. The cathode ray tube includes an envelope member 11 which in turn includes a face panel portion 13 and a funnel portion 19. The face panel portion 13 includes a face plate portion 15 and a skirt portion 17 and the funnel portion 19 includes a flared portion 21 and a neck portion 23. A luminescent screen 25 has been deposited upon the interior of the face plate portion 15. Electron beam generating means 27 have been positioned within the neck portion 23 and generate electron beams 29 which, after traveling through the shadow mask electrode apertures 33 of a shadow mask electrode 31, impinge upon the luminescent screen 25, which is comprised of a number of phosphor dots 35. For simplicity, only a few apertures 33 of the shadow mask electrode 31 and a few dots 35 of the luminescent screen 25 are shown. A conductive coating 39 has been applied to the interior of the envelope member 11 and the face panel portion 13 has been sealed to the funnel portion 19 at a sealed portion 41.

As can be seen, it is extremely important for the shadow mask electrode 31 to be made of the same dimensions and configurations in every cathode ray tube in which it is used in order to provide proper registration of the electron beams 29 which strike the phosphor dots 35. In accordance with our invention, the shadow mask electrode 31 may be made in the following manner. As shown in FIG. 2, a master die member 43 is prepared having a plurality of apertures 45 of the desired size, shape and position and having a conductive surface 47. A suitable material of which the master die member may be made is stainless steel. Then a plastic insulative material 49 is extruded through the apertures 45 of the master die member 43 as shown in FIG. 3, so that columns 51 are formed which extend to a desired height above the conductive surface 47 of the master die 43.

A large variety of materials may be used for the insulative plastic material 49. The choice of the plastic material depends upon the desired temperature of extrusion and the fact that the softening temperature of the plastic material must be above the temperature of the electroplating solution as described below. A suitable material we have used is paraffin which, at a temperature of 44° C., can be extruded through 0.010 inch diameter apertures with reasonable pressure from a plunger and will form straight columns to any reasonable height desired. It is usually desirable to form these columns slightly higher than the thickness desired in the electroformed layer described below to prevent closing of holes during electroplating and to maintain accurate duplication of the master die apertures. Other suitable plastic materials include waxes such as beeswax and plastics such as those suitable for precision casting.

After the extrusion, the master die 43 and the plastic material 49 are allowed to cool and then, if desired, may be separated from the bulk plastic by a wire or a thin knife. Then the master die 43 with the projecting insulating columns 51 on one side and covered with insulating material 49 on the other side is electrolytically plated with a layer of a desired conductive material such as copper, nickel, alloys or other materials. Of course, before the conductive layer 53 is deposited as shown in FIG. 4, any suitable means of making electrical contact with the master die member 43 must be provided, such as removing the plastic from a small spot on the master die for electrical contact. Any desired electroplating solution may be used which is consistent with the softening point of the plastic material 49. One solution we have used for electroplating copper with paraffin as the plastic material 49 has been an acid copper-sulphate solution which contains 30 ounces of copper-sulphate ($CuSO_4.5H_2O$) per gallon of water and 9 ounces of 3GN sulphuric acid per gallon of water. This electroplating solution may be operated at room temperature with a current density ranging between 25 to 50 amperes per square foot. Also, this electroplating solutions may be agitated during use. With these materials, an electrolytic copper anode is preferable.

After the layer of electroplated material 53 has been deposited to a suitable thickness which, as shown in FIG. 4, should be somewhat less than the thickness of the plastic columns 51, the plastic material 49 is removed by suitable methods. In some applications it may be desirable to remove all of the plastic material while in others it may be desirable to remove only the tops of the columns 51 to a depth below the conductive surface 47 of the master die member 43. The plastic material 49 may be removed by suitable methods such as applying heat, which will melt the plastic material, or using a solvent. For example, with paraffin, a solvent such as trichloroethylene, carbontetrachloride or any other suitable solvent that will dissolve the plastic material 49 and will not attack the electroformed layer 53 or the master die member 43 may be used. After the plastic member 49 has been removed as shown in FIG. 5, the layer of conductive material 53 may be peeled from the master die 43 to form an electroformed aperture screen member 57 as shown in FIG. 6, including apertures 55. The master die 43, of course, may be used numerous times and the plastic material can be recovered in some instances and reused.

As shown in FIGS. 2 through 6, the small portion of the master die 43, the conductive layer 53, etc. are planar. However, our method is adaptable to be used in making a curved shadow mask such as illustrated in FIG. 1. In fact, the electroformed apertured screen member may be made in any shape desired by using a master die 43 of the desired shape. In the prior art method of acid etching, the screen member usually had to be formed or shaped after the etching process which involved the use of additional tools, further manufacturing processes and the danger of distorting the apertures or their relationship to each other.

With the use of suitable insulative plastic materials, an apertured screen member may be made to greater thicknesses than allowable with the acid etching method since the etching tends to enlarge the aperture size as the thicknes of the screen member is increased which, of course, is undesirable and inaccurate. Also with our method, any metal that can be electrodeposited may be used while the acid etching method is limited in this respect.

While this invention has been shown in making a shadow mask electrode for a color television tube, it may also be used in any instance where a metallic screen or mesh structure must be reproduced. This invention also has the advantage of producing a number of identical apertured members in sizes, shapes and contour which are ordinarily difficult to produce, and with apertures that have a sharp and exact outline. Also gasket shapes, metallic brazing performs and other apertured members may be made without wasted metal. Aperture members may be formed in complex curvatures without distortion of the apertures of their spacing.

While the present invention has been shown in one form only, it will be obvious to those skilled in the art that it is not so limited but is susceptible of various changes and modifications without departing from the spirit and scope thereof.

We claim as our invention:

1. The method of making an apertured metallic member, said method utilizing a reusable master die having a conductive surface and a plurality of apertures, said method including the steps of extruding an insulative plastic material through said apertures so that a column of said plastic material extends through each of said apertures to a first height above said conductive surface, electrodepositing a layer of conductive material upon said conductive die surface, said layer having a thickness less than said first height, removing the portions of said insulative plastic material which are adjacent said layer of conductive material, and removing said layer of conductive material from said master die so that said master die may be used again.

2. The method of making an apertured metallic member, said method utilizing a reusable master die having a conductive surface and a plurality of apertures, said method including the steps of extruding an insulative plastic material through said apertures so that a column of said plastic material extends through each of said apertures to a first height above said conductive surface, electrodepositing a layer of conductive material upon said conductive die surface, said layer having a thickness less than said first height, removing by a heating process the portions of said insulative plastic material which are adjacent said layer of conductive material, and removing said layer of conductive material from said master die so that said master die may be used again.

3. The method of making an apertured metallic member, said method utilizing a master die having a conductive surface and a reusable plurality of apertures, said method including the steps of extruding an insulative plastic material through said apertures so that a column of said plastic material extends through each of said apertures to a first height above said conductive surface, electropositing a layer of conductive material upon said conductive die surface, said layer having a thickness less than said first height, removing by a dissolving process the portions of said insulative plastic material which are adjacent said layer of conductive material, and removing said layer of conductive material from said master die so that said master die may be used again.

References Cited in the file of this patent

UNITED STATES PATENTS

| | | |
|---|---|---|
| 1,311,275 | Harrison | July 29, 1919 |
| 2,123,297 | Beynen et al. | July 12, 1938 |
| 2,166,367 | Norris | July 18, 1939 |
| 2,287,122 | Norris | June 23, 1942 |
| 2,598,318 | Teal | May 27, 1952 |